United States Patent
Lu et al.

(10) Patent No.: US 11,170,719 B1
(45) Date of Patent: Nov. 9, 2021

(54) TFT PIXEL THRESHOLD VOLTAGE COMPENSATION CIRCUIT WITH A SOURCE FOLLOWER

(71) Applicant: Sharp Kabushiki Kaisha, Osaka (JP)

(72) Inventors: Tong Lu, Oxford (GB); Kohhei Tanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 17/117,476

(22) Filed: Dec. 10, 2020

(51) Int. Cl.
| | |
|---|---|
| *G09G 3/30* | (2006.01) |
| *G09G 3/3258* | (2016.01) |
| *G09G 3/3291* | (2016.01) |
| *H01L 27/32* | (2006.01) |
| *G09G 3/20* | (2006.01) |

(52) U.S. Cl.
CPC ......... *G09G 3/3258* (2013.01); *G09G 3/2092* (2013.01); *G09G 3/3291* (2013.01); *H01L 27/3262* (2013.01); *H01L 27/3265* (2013.01); *G09G 2330/021* (2013.01)

(58) Field of Classification Search
CPC ............. H01L 27/3272; H01L 27/3265; H01L 27/3276; H01L 27/3262; G09G 3/32; G09G 3/3258; G09G 2300/0439; G09G 2310/0232; G09G 2310/0281; G09G 3/2092; G09G 3/3291; G09G 2330/021; G09G 3/30
See application file for complete search history.

(56) References Cited

U.S. PATENT DOCUMENTS

| | | | |
|---|---|---|---|
| 7,414,599 B2 | 8/2008 | Chung et al. | |
| 9,626,905 B2 | 4/2017 | In et al. | |
| 10,242,622 B2 | 3/2019 | Tseng et al. | |
| 10,304,378 B2 | 5/2019 | Lin et al. | |
| 2016/0225318 A1* | 8/2016 | Choi ................ | G09G 3/3258 |
| 2016/0253958 A1* | 9/2016 | Ma ................... | G09G 3/3225 345/211 |
| 2017/0330927 A1* | 11/2017 | Lee .................. | G09G 3/3266 |
| 2019/0088200 A1* | 3/2019 | Woo ................. | H01L 51/56 |
| 2019/0096337 A1* | 3/2019 | Zhu .................. | G09G 3/3233 |
| 2019/0326560 A1* | 10/2019 | Cha ................. | H01L 27/3248 |

* cited by examiner

*Primary Examiner* — Pegeman Karimi
(74) *Attorney, Agent, or Firm* — Renner, Otto, Boisselle & Sklar, LLP

(57) ABSTRACT

An enhanced pixel circuit for a display device provides separate compensation and data programming phases to permit minimization of the programming time. Variations in voltage supplies are accounted for by isolating the drive transistor from such power supply by using a second drive transistor configured as source follower relative to the first drive transistor. An on bias stress transistor is incorporated that can electrically connect the first drive transistor to the power supply during an on bias stress operation. During such operation, a voltage stress is applied to eliminate hysteresis effects associated with the drive transistor. The on bias stress operation may be performed as part of a refresh operation during which a data voltage is programmed to the pixel circuit, or as part of a low frequency operation during which a previously programming data voltage is maintained which reduces power consumption.

20 Claims, 6 Drawing Sheets

TFT PIXEL THRESHOLD VOLTAGE COMPENSATION CIRCUIT WITH A SOURCE FOLLOWER

TECHNICAL FIELD

The present application relates to design and operation of electronic circuits for delivering electrical current to an element in a display device, such as for example to an organic light-emitting diode (OLED) in the pixel of an active matrix OLED (AMOLED) display device.

BACKGROUND ART

Organic light-emitting diodes (OLED) generate light by re-combination of electrons and holes, and emit light when a bias is applied between the anode and cathode such that an electrical current passes between them. The brightness of the light is related to the amount of the current. If there is no current, there will be no light emission, so OLED technology is a type of technology capable of absolute blacks and achieving almost "infinite" contrast ratio between pixels when used in display applications.

Several approaches are taught in the prior art for pixel thin film transistor (TFT) circuits to deliver current to an element of a display device, such as for example an organic light-emitting diode (OLED), through a p-type drive transistor. In one example, an input signal, such as a low "SCAN" signal, is employed to switch transistors in the circuit to permit a data voltage, VDAT, to be stored at a storage capacitor during a programming phase. When the SCAN signal is high and the switch transistors isolate the circuit from the data voltage, the VDAT voltage is retained by the capacitor, and this voltage is applied to a gate of a drive transistor. With the drive transistor having a threshold voltage VTH, the amount of current to the OLED is related to the voltage on the gate of the drive transistor by:

$$I_{OLED} = \frac{\beta}{2}(V_{DAT} - V_{DD} - V_{TH})^2$$

where $V_{DD}$ is a power supply connected to the source of the drive transistor.

TFT device characteristics, especially the TFT threshold voltage $V_{TH}$, may vary with time or among comparable devices, for example due to manufacturing processes or stress and aging of the TFT device over the course of operation. With the same VDAT voltage, therefore, the amount of current delivered by the drive TFT could vary by a significant amount due to such threshold voltage variations. Therefore, pixels in a display may not exhibit uniform brightness for a given VDAT value.

Conventionally, therefore, OLED pixel circuits have high tolerance ranges to variations in threshold voltage and/or carrier mobility of the drive transistor by employing circuits that compensate for mismatch in the properties of the drive transistors. For example, an approach is described in U.S. Pat. No. 7,414,599 (Chung et al., issued Aug. 19, 2008), which describes a circuit in which the drive TFT is configured to be a diode-connected device during a programming period, and a data voltage is applied to the source of the drive transistor.

The threshold compensation time is decided by the drive transistor's characteristics, which may require a long compensation time for high compensation accuracy. For the data programming time, the RC constant time required for charging the programming capacitor is determinative of the programming time. As is denoted in the art, the one horizontal (1H) time is the time that it takes for the data to be programmed for one row.

With such circuit configuration as in U.S. Pat. No. 7,414,599, the data is programmed at the same time as when the threshold voltage of the drive transistor is compensated. It is desirable, however, to have as short of a one horizontal time as possible to enhance the responsiveness and operation of the display device. This is because each row must be programmed independently, whereas other operations, such as for example drive transistor compensation, may be performed for multiple rows simultaneously. The responsiveness of the display device, therefore, tends to be dictated most by the one horizontal time for programming. When the data is programmed during the same operational phase that the drive transistor is compensated, the one horizontal time cannot be reduced further due to compensation accuracy requirements for the drive transistor, as the compensation requirements limit any time reductions for the programming phase.

Another drawback of circuits configured comparably as described in U.S. Pat. No. 7,414,599 is that the voltage variation at the power supply line, such as the IR drop at the driving voltage power supply line ELVDD, will affect the OLED current. At the end of the data programming and threshold compensation phase, the stored voltage across the capacitor is:

$$V_{DD_{PROG}} = (V_{DAT} - |V_{TH}|)$$

where $V_{DD_{PROG}}$ is the ELVDD voltage at the end of the programming and compensation phase, which is applied to a first plate of the storage capacitor. $V_{DAT} - |V_{TH}|$ is the programmed and compensated voltage at a second plate of the storage capacitor.

The IR drop for each pixel on the same SCAN row can be different depending on the programming data voltage. Similarly, the IR drop for pixels on different rows are different depending on the emission data. The IR drop difference means that the ELVDD supply voltage $V_{DD_{PROG}}$ during programming will be different for each pixel. This difference can cause differences in OLED current even when the programmed data voltages are the same and the threshold voltage has been compensated perfectly. The uniformness of the display will be degraded by the ELVDD voltage supply variations resulting from differences in the IR drop.

One approach to accounting for voltage variations arising from such IR drop is described in Applicant's pending patent application, U.S. application Ser. No. 16/740,763 (Lu et al., filed Jan. 13, 2020). The described pixel circuit configurations (1) provide for separate compensation and data programming phases to permit minimization of the one horizontal (1H) time, and (2) account for variations in the voltage supply VDD to enhance the uniformity of the display device output. Such circuit configurations are capable of compensating the threshold voltage variations of the drive transistor with an ultra-short one horizontal time 1H of less than about 2 µs, which is shorter as compared to conventional configurations. In addition, the pixel circuit configurations isolate the power supplies from the drive transistors. Any power supply variations, therefore, such as caused by an IR drop from the power supply to the drive transistor, will not affect the current to the OLED. An image having a generally uniform luminance thus can be displayed regardless of the voltage drop variations of the power supplies.

A drawback of the pixel circuit configurations described in the '763 application is that to implement the driving schemes, a dedicated SCAND control signal is incorporated to provide the data voltage input. Accordingly, the additional control signal lines required to deliver the dedicated SCAND control signal to each pixel increases the size of the bezel, and this increased size is undesirable. There also is a growing need for low frequency driving, such as 1 Hz driving, which in particular is useful for the display of more static images. Low frequency operation raises different issues in terms of compensation and performance, including detrimental effects of drive transistor hysteresis, and the '763 application is not drawn to accounting for issues associated with low frequency driving.

One approach for addressing drive transistor hysteresis is described in U.S. Ser. No. 10/304,378 (Lin et al., issued May 28, 2019), which discloses a method to reduce the drive transistor hysteresis. A constant high voltage is applied to the gate and source of the drive transistor to reduce the threshold voltage variation dependence on the previous gate-source voltage difference, but the described implementation requires a complicated switching mechanism at the data line to apply the high voltage.

SUMMARY OF INVENTION

There is a need in art, therefore, for an enhanced pixel circuit that provides for separate compensation and data programming phases to permit minimization of the one horizontal (1H) time, and accounts for variations in the voltage supply to enhance the uniformity of the display device output. Embodiments of the current application further improve over prior circuit configurations by (1) using a scan signal from another row to render unnecessary a dedicated data signal and associated additional control signal lines, which results in a narrower bezel; (2) removes the effects of data signal variations as a result of using the scan signal from another row; and (3) reduces the drive transistor hysteresis by applying a stress voltage at the gate and source of the drive transistor without employing additional complicated data line switches. The pixel circuits are capable of compensating the threshold voltage variations of the drive transistor with an ultra-short one horizontal time 1H of less than about 2 µs, which is shorter as compared to conventional configurations. In addition, the pixel circuit configurations described in the current application isolate the power supplies from the drive transistor. Any power supply variations, therefore, such as caused by an IR drop from the power supply to the drive transistor, will not affect the current to the OLED. An image having a generally uniform luminance thus can be displayed regardless of the voltage drop variations of the power supplies.

Embodiments of the present application provide pixel circuits for high refresh rate requirements, such as for 120 Hz applications. For such applications, an ultra-short 1H time (<2 µs) is achieved via separation of threshold compensation of the drive transistors and data programming phases. The threshold compensation time is dictated by the drive transistor characteristics and is difficult to reduce further without degrading the compensation accuracy. By separating the threshold compensation and data programming phases, a longer time can be allocated to threshold compensation for compensation accuracy. As referenced above, the RC constant time required for charging the programming capacitor is determinative of the programming time, and such programming time can be reduced to ultra-short 1H times (<2 µs).

Variations in voltage supplies, ELVDD, are accounted for by isolating the drive transistor from such power supply. To isolate the drive transistor from the power supply ELVDD, a second drive transistor configured as source follower relative to the first drive transistor is connected between the first drive transistor and the power supply ELVDD. The source voltage of the first drive transistor is driven by the output of the source follower configured from the second drive transistor. The source voltage of the first drive transistor, therefore, is no longer affected by variations in the power supply ELVDD. Hence, any IR drop on the power supply ELVDD line will not cause non-uniform luminance.

In addition, an on bias stress transistor is incorporated that can electrically connect the first drive transistor to the power supply ELVDD during an on bias stress operation. During such operation, a voltage stress is applied to eliminate hysteresis effects associated with the drive transistor. The on bias stress operation may be performed as part of a refresh operation during which a data voltage is programmed to the pixel circuit, or as part of a low frequency operation during which a previously programming data voltage is maintained. The pixel circuit, therefore, is operable in two modes of operation including a refresh or normal operation, and low frequency or non-refresh operation. The normal or refresh operation is suitable for more dynamic images when the data voltage value is repeatedly being refreshed, whereas the low frequency or non-refresh operation is particularly suitable more static images when the data voltage value largely is remaining constant. Power consumption thus can be reduced.

In exemplary embodiments, low leakage transistors, such as IGZO (indium gallium zinc oxide) transistors, can be used as the switch transistors connected to respective voltage supply lines. By using low leakage transistors, either a low storage capacitor can be used to reduce the pixel size or a low refresh rate such as 30 Hz or lower can be used to better display static or low motion images.

An aspect of the invention, therefore, is a pixel circuit for a display device whereby the one horizontal time is minimized while maintaining accurate compensation of the threshold voltages of the drive transistors, and an on bias stress operation is performed to apply a voltage stress to eliminate hysteresis effects associated with the drive transistor. In exemplary embodiments, the pixel circuit includes a first drive transistor configured to control an amount of current to a light-emitting device during an emission phase depending upon a voltage applied to a gate of the first drive transistor, the first drive transistor having a first terminal and a second terminal; a second drive transistor that is configured as a source follower relative to the first drive transistor, wherein a first terminal of the second drive transistor is connected to a first power supply line and a second terminal of the second drive transistor is connected to the second terminal of the first drive transistor; wherein the first drive transistor is one of a p-type or n-type transistor and the second drive transistor is the other of a p-type or n-type transistor; a light-emitting device that is electrically connected at a first terminal to the first terminal of the first drive transistor during the emission phase and is connected at a second terminal to a second power supply line; and an on bias stress switch transistor having a first terminal connected to the first power supply line and the first terminal of the second drive transistor, and a second terminal connected to a node Vx that is a connection of the second terminal of the first drive transistor and the second terminal of the second drive transistor, wherein when the on bias stress switch transistor is in an on state the first power supply line is electrically connected to the node Vx to apply a voltage stress to eliminate hysteresis effects.

In exemplary embodiments, the pixel circuit further includes a first capacitor and a second capacitor, wherein the first capacitor is connected at a first plate to the gate of the first drive transistor and at a second plate to a first plate of the second capacitor, and the second capacitor is connected at a second plate to the gate of the second drive transistor. The first capacitor is used for the threshold compensation to store the threshold voltages of the drive transistors during the compensation phase, and the second capacitor is used to store the data voltage during the programming phase and the emission phase. The threshold compensation and data programming operations thus are independent of each other, and a short one horizontal time can be achieved with a short data programming phase while performing accurate compensation. The pixel circuit further may include multiple switch transistors that control the application of supply voltages to the first and second drive transistors, to the first and second capacitors, and to the light-emitting device, during the different phases of operation.

The pixel circuit is operable to perform a refresh operation in which the pixel circuit is programmed with a data voltage for the emission phase, wherein during the data programming phase an on bias stress operation is performed to eliminate hysteresis effects. The pixel circuit also is operable to perform a low frequency operation during which a previously programmed data voltage is maintained, wherein the low frequency operation includes resetting an anode of the light-emitting device and performing an on bias stress operation to eliminate hysteresis effects, and then returning to the emission phase. The low frequency operation may be performed multiple times periodically following one refresh operation to generate a more static image.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF EMBODIMENTS

Figure 1:
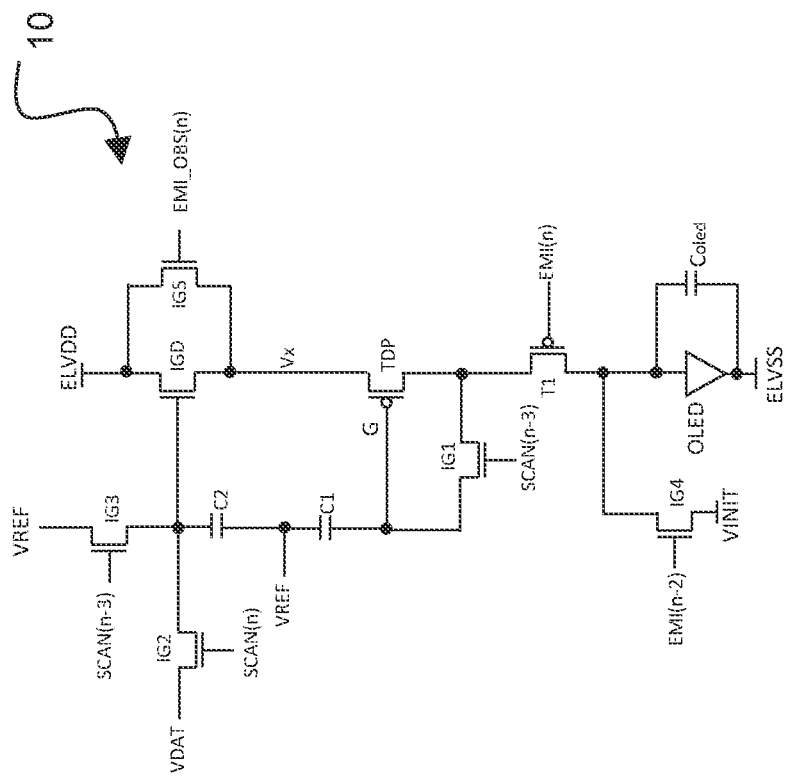
FIG. 1 is a drawing depicting a first circuit configuration in accordance with embodiments of the present application.

Embodiments of the present application will now be described with reference to the drawings, wherein like reference numerals are used to refer to like elements throughout. It will be understood that the figures are not necessarily to scale.

Figure 2:
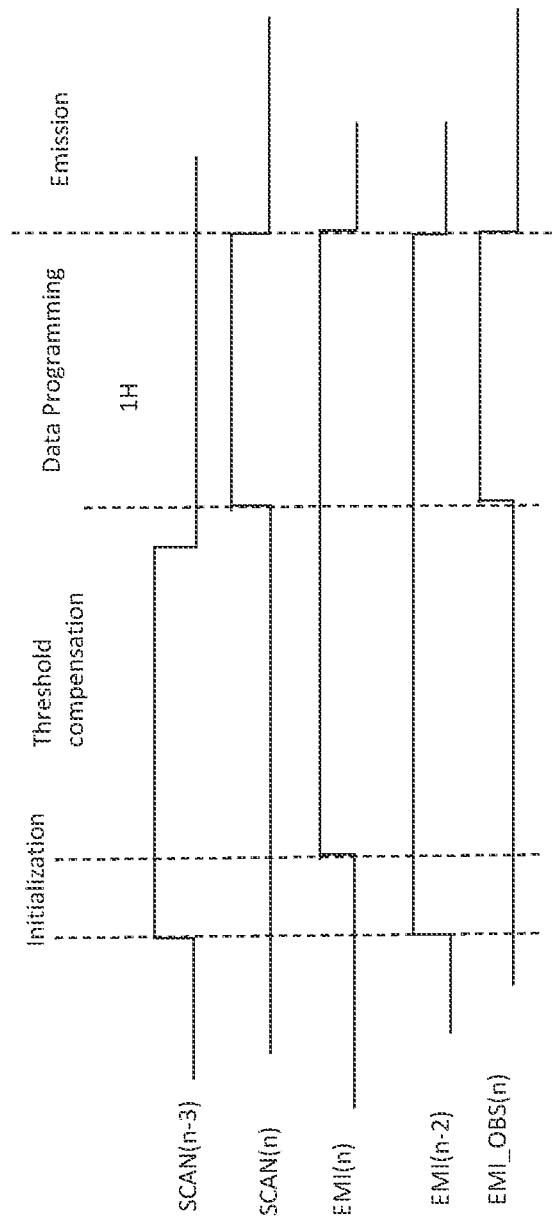
FIG. 2 is a drawing depicting a timing diagram associated with the operation of the circuit of FIG. 1 that is suitable for a refresh operation.
Figure 3:
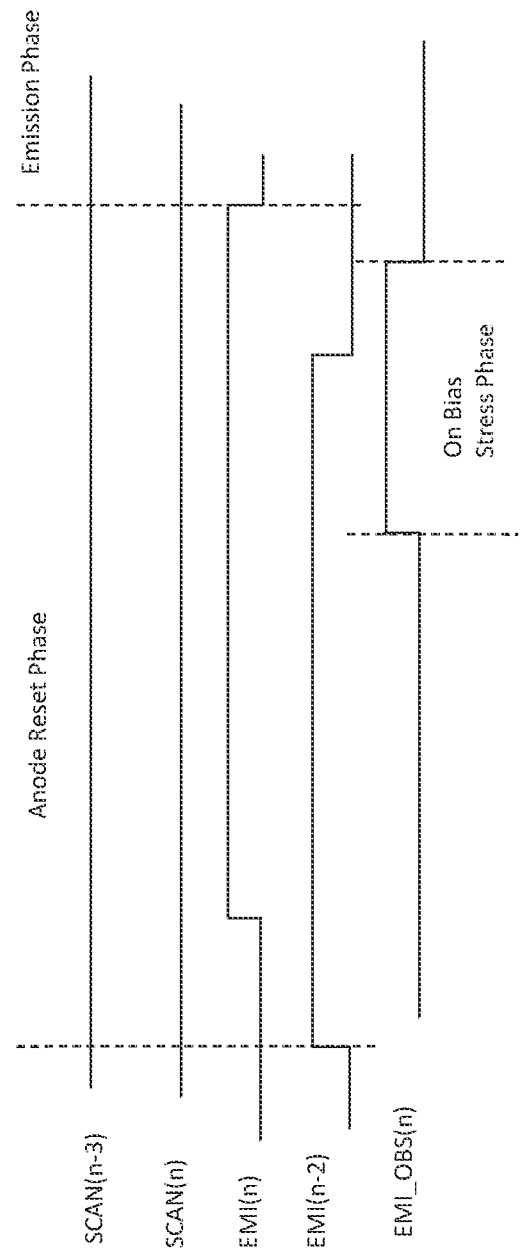
FIG. 3 is a drawing depicting a timing diagram associated with the operation of the circuit of FIG. 1 that is suitable for low frequency operation.

FIG. 1 is a drawing depicting a first circuit configuration 10 in accordance with embodiments of the present application, and FIG. 2 is a timing diagram associated with the operation of the circuit configuration 10 of FIG. 1 that is associated with a normal or refresh operation. FIG. 3 is a drawing depicting a timing diagram associated with the operation of the circuit of FIG. 1 that is suitable for low frequency or non-refresh operation.

In this example, the circuit 10 is configured as a thin film transistor (TFT) circuit that includes multiple p-type transistors $T_{DP}$ and T1, multiple n-type transistors $IG_D$ and IG1~IG5, and two storage capacitors C1 and C2. In exemplary embodiments, the p-type transistors are low-temperature polycrystalline silicon (LTPS) devices, which have higher mobility, and the n-type transistors are oxide transistors such as indium gallium zinc oxide (IGZO) devices, which have ultra-low leakage between the source and drain. The circuit elements drive a light-emitting device, such as for example an organic light-emitting device (OLED). The light-emitting device (OLED) has an associated internal capacitance, which is represented in the circuit diagram as $C_{oled}$. The OLED further is connected to a power supply ELVSS as is conventional. In addition, although the embodiments are described principally in connection with an OLED as the light-emitting device, comparable principles may be used with display technologies that employ other types of light-emitting devices, including for example micro LEDs and quantum dot LEDs.

More specifically, FIG. 1 depicts the TFT circuit 10 configured with multiple p-type TFTs and n-type TFTs. $T_{DP}$ is a p-type drive transistor that is an analogue TFT, and T1 is a p-type digital switch TFT. $IG_D$ is an n-type drive transistor that is an analogue TFT, and transistors IG1, IG2, IG3, IG4, and IG5 are n-type digital switch TFTs. More generally, the first drive transistor is one of a p-type or n-type transistor and the second drive transistor is the other of a p-type or n-type transistor. As referenced above, C1 and C2 are storage capacitors, and $C_{oled}$ is the internal capacitance of the OLED device (i.e., $C_{oled}$ is not a separate component, but is inherent to the OLED).

The OLED and the TFT circuit 10, including the transistors, capacitors and connecting wires, may be fabricated using TFT fabrication processes conventional in the art. It will be appreciated that comparable fabrication processes may be employed to fabricate the TFT circuits according to any of the embodiments.

For example, the TFT circuit 10 (and subsequent embodiments) may be disposed on a substrate such as a glass, plastic, or metal substrate. Each TFT may comprise a gate electrode, a gate insulating layer, a semiconducting layer, a first electrode, and a second electrode. The semiconducting layer is disposed on the substrate. The gate insulating layer is disposed on the semiconducting layer, and the gate electrode may be disposed on the insulating layer. The first electrode and second electrode may be disposed on the insulating layer and connected to the semiconducting layer using vias. The first electrode and second electrode respectively may commonly be referred to as the "source electrode" and "drain electrode" of the TFT. The capacitors each may comprise a first electrode, an insulating layer and a second electrode, whereby the insulating layer forms an insulating barrier between the first and second electrodes. Wiring between components in the circuit, and wiring used to introduce signals to the circuit (e.g. SCAN, EMI, VDAT, VINIT and VREF) may comprise metal lines or a doped semiconductor material. For example, metal lines may be disposed between the substrate and the gate electrode of a TFT, and connected to electrodes using vias. The semiconductor layer may be deposited by chemical vapour deposition, and metal layers may be deposited by a thermal evaporation technique.

The OLED device may be disposed over the TFT circuit. The OLED device may comprise a first terminal (e.g. anode of the OLED), which is connected to transistors T1 and IG4 in this example, one or more layers for injecting or transporting charge (e.g. holes) to an emission layer, an emission layer, one or more layers for injecting or transporting electrical charge (e.g. electrons) to the emission layer, and a second terminal (e.g. cathode of the OLED), which is connected to power supply ELVSS in this example. The injection layers, transport layers and emission layer may be organic materials, the first and second electrodes may be metals, and all of these layers may be deposited by a thermal evaporation technique.

As described in more detail below, variations in voltage supply ELVDD are accounted for by isolating the first drive transistor $T_{DP}$ from such power supply. To isolate the first drive transistor from the power supply ELVDD, the second drive transistor $IG_D$ is configured as a source follower relative to the first drive transistor, whereby the output of the source follower follows the gate voltage of the second drive transistor. The gate of the second drive transistor is electrically connectable to a reference voltage supply line, and because of the high capacitance at the gate of $IG_D$, there is little current flow through the reference voltage supply line and hence there is no IR drop issue associated with the reference voltage. The source voltage of the first drive transistor is driven by the output of the source follower configured by the second drive transistor. Hence, any IR drop on the power supply ELVDD line will not affect the current to the OLED, which avoids the non-uniform luminance that can be experienced in conventional configurations.

The source voltage of the first drive transistor, therefore, is no longer affected by variations in the power supply ELVDD. In addition, during compensation the threshold voltages of the first and the second drive transistors are stored at capacitor C1, and the data voltage VDAT is stored at capacitor C2 and applied to the second drive transistor for data programming.

Embodiments of the present application use ultra-low leakage oxide transistors, such as indium gallium zinc oxide (IGZO) devices, as the data switch device and the switches associated with the storage capacitors C1 and C2. This permits the stored data voltage and stored drive transistor threshold voltages to be retained longer on the capacitors due to the ultra-low off leakage property of the ultra-low leakage transistors. As a result, the refresh rate can be reduced as compared to conventional configurations, down to about 30 Hz or lower, which is particularly suitable for displaying static images.

The pixel circuit is operable in two modes of operation that are referred to in this application as normal or refresh operation and low frequency or non-refresh operation. The low frequency operation is particularly suitable more static images in which the data voltage value is not changing, whereas the refresh operation is suitable for more dynamic images in which the data voltage value is being repeatedly refreshed. The timing diagram of FIG. 2 is associated with the normal or refresh operation, and the timing diagram of FIG. 3 is associated with the low frequency or non-refresh operation.

In general, for the refresh operation the pixel circuit operates multiple full cycles, each cycle including an initialization phase, a threshold compensation phase, a data programming phase, and an emission phase, wherein each cycle essentially corresponds to a frame in which a new data voltage is being programmed. For the low frequency operation, the pixel circuit first operates a full cycle of refresh operation to program the data voltage to the pixel. Then for the low frequency operation, the data voltage value is static as the image is not changing. Accordingly, following a full cycle of refresh operation in which the corresponding data voltage is programmed, the pixel circuit then operates via the emission control signal only. Periodically, to avoid deterioration of the image, the circuit is operated to reset the anode voltage at the OLED and to apply an on bias stress input to the gate and source of the drive transistors to reduce the hysteresis. The low frequency operation reduces the power consumption by eliminating the initialization phase, threshold compensation phase, and data programming phase when the image is static, as the corresponding data voltage value is static over a relatively longer period of time to produce the static image. To change the data voltage value thereby changing the outputted image, a new data voltage may be programmed by returning operation to the normal operation and performing another refresh phase.

Referring to the TFT circuit 10 of FIG. 1 in combination with the timing diagram of FIG. 2, for the normal or refresh operation, the TFT circuit 10 operates to perform in four phases: an initialization phase, a threshold compensation phase, a data programming phase, and an emission phase for light emission. The time period for performing the programming phase is referred to in the art as the "one horizontal time" or "1H" time as illustrated in the timing diagram and in subsequent the timing diagrams. A short 1H time is a requirement for displays with a large number of pixels in a column, as is necessary for high-resolution displays and for high refresh rates such as used for 120 Hz applications. As referenced above, a short one horizontal time is significant because each row must be programmed independently, whereas other operations, such as for example drive transistor threshold compensation, may be performed for multiple rows simultaneously. The responsiveness of the device, therefore, tends to be dictated most by the one horizontal time for programming.

Generally, this embodiment and subsequent embodiments have comparable control signals EMI and SCAN for other rows of pixels in the overall or broader display device, thereby enabling fewer control signal wires in a display configuration as common control lines may be shared over different rows. For this example and in subsequent embodiments, display pixels are addressed by row and column. The current row is row n. The previous row is row n−1, and the second previous row is n−2. The next row is row n+1, and the row after that is row n+2, and so on for the various rows as they relate to the corresponding control signals identified in the figures. Accordingly, for example, SCAN(n) refers to the scan signal at row n and SCAN(n−3) refers to the scan signal at row n−3, and the like. EMI(n) refers to the emission signal at row n and EMI(n−2) refers to the emission signal at row n−2, and the like, and so on for the various control signals. In this manner, for the various embodiments the input signals correspond to the indicated rows.

In this first embodiment, during the previous emission phase, the EMI(n) signal level has a low voltage value, so transistor T1 is in an on state, and light emission is being driven by the input driving voltage ELVDD connected to a first terminal of the IGZO second drive transistor $IG_D$, whereby the actual current applied to the OLED is determined by the voltage at the gate of the p-type first drive transistor $T_{DP}$ and the voltage at the gate of the second drive transistor $IG_D$. The SCAN signal levels for the applicable rows initially have a low voltage value so transistors IG1~IG4 are all in an off state. The EMI_OBS signal level for the applicable rows also initially has a low voltage value so transistor IG5 also is in an off state.

The initialization phase is performed to initialize the various circuit voltages, such as voltages at the OLED, the storage capacitors and the drive transistors. At the beginning of the initialization phase, the EMI(n-2) signal level is changed from a low voltage value to a high voltage value, causing transistor IG4 to be placed in an on state. Switch transistor IG4 has a first terminal connected to a first terminal (anode) of the light-emitting device (OLED) and a second terminal connected to an initialization voltage supply line that supplies an initialization voltage VINIT. As transistor IG4 is turned on, the anode of OLED is electrically connected to the initialization voltage supply line VINIT through IG4 to initialize the OLED voltage. The initialization voltage VINIT is set to a sufficiently low voltage such that any light emission from the OLED is turned off. In particular, the VINIT voltage is set to lower than the threshold voltage of the OLED plus ELVSS, and thus the VINIT voltage does not cause light emission when applied at anode of the OLED.

Also during the initialization phase, the SCAN(n-3) signal level is changed from a low voltage value to a high voltage value, causing switch transistors IG1 and IG3 to be placed in the on state. Switch transistor IG1 has a first terminal connected to the gate of the first drive transistor $T_{DP}$, and a second terminal connected to a first terminal (i.e. drain) of the first drive transistor $T_{DP}$. Switch transistor IG3 has a first terminal connected to the gate of the second drive transistor $IG_D$, and a second terminal connected to a reference voltage supply line that supplies a reference voltage VREF. As transistor IG1 is turned on, the gate and first terminal (drain) of the p-type first drive transistor $T_{DP}$ are electrically connected to each other through switch transistor IG1, and the drive transistor $T_{DP}$ becomes diode-connected. Diode-connected refers to the drive transistor $T_{DP}$ being operated with its gate and another terminal (e.g., source or drain) being electrically connected to each other, such that current flows in one direction.

As transistor IG3 is turned on, the reference voltage VREF is applied from the reference voltage supply line to the gate of the n-type IGZO second drive transistor $IG_D$ through IG3. The reference voltage VREF is set to satisfy the equation below, such that VREF will be:

$$V_{REF} > V_{INIT} + |V_{THp}| + V_{THn}$$

where $V_{THp}$ is the threshold voltage of the p-type first drive transistor $T_{DP}$, and $V_{THn}$ is the threshold voltage of the n-type IGZO second drive transistor $IG_D$. As referenced above, p-type switch transistor T1 is in the on state from the EMI(n) signal remaining low from the previous emission phase. Switch transistor T1 has a first terminal connected to the first terminal (anode) of the OLED and a second terminal connected to the first terminal (drain) of the p-type first transistor $T_{DP}$. As T1 is on, the initialization voltage VINIT is also applied to the diode-connected gate-drain of the p-type drive transistor $T_{DP}$ to initialize the drive transistor voltage.

As seen in FIG. 1, a node G in denoted where a first or bottom plate of the first storage capacitor C1 and the gate of the p-type first drive transistor $T_{DP}$ are connected. A node Vx is denoted where a second terminal (source) of the p-type first drive transistor $T_{DP}$ and a second terminal (source) of the n-type IGZO second drive transistor $IG_D$ are connected. As referenced above the first terminal (drain) of the second drive transistor $IG_D$ is connected to the voltage supply line that supplies the driving voltage ELVDD. With such circuit configuration, during the initialization phase a voltage at the node Vx also is pulled down by VINIT. At the end of initialization phase, the voltage level of Vx will be:

$$V_{INIT} + |V_{THp}| < V_x \leq V_{REF} - V_{THn}$$

The TFT circuit 10 next is operable in a threshold compensation phase, during which the threshold voltages of the p-type first drive transistor $T_{DP}$ and n-type IGZO second drive transistor $IG_D$ are compensated. For such phase, the EMI(n) signal level is changed from a low voltage value to a high voltage value, causing transistor T1 to be placed in the off state, and the diode-connected gate-drain of the p-type first drive transistor $T_{DP}$ becomes floating. The voltage at node Vx becomes floating as well. Therefore, during the threshold compensation phase the Vx voltage is pulled up towards $V_{REF} - V_{THn}$ as the n-type IGZO second drive transistor $IG_D$ is turning off. The voltage at node G, where the gate of the diode-connected p-type first drive transistor $T_{DP}$ and the first plate of the first storage capacitor C1 are connected, is pulled up towards $V_x - |V_{THp}|$ as the p-type drive transistor $T_{DP}$ is turning off.

At the end of the threshold compensation phase, the SCAN(n-3) signal level is changed from the high voltage value to the low voltage value, causing switch transistors IG1 and IG3 to be placed in the off state. As transistor IG1 is turned off, the gate and the drain of the p-type first drive transistor $T_{DP}$ are electrically disconnected from each other and the p-type drive transistor $T_{DP}$ is no longer diode-connected. The voltage at node G is $V_{REF} - V_{THn} - |V_{THp}|$. As referenced above, the first storage capacitor C1 has a first (bottom) plate connected to the node G, and a second (top) plate of capacitor C1 is connected to a first (bottom) plate of the second storage capacitor C2. A second (top) plate of the capacitor C2 is connected to the gate of the second drive transistor $IG_D$. In addition, the second plate of C1 and the first plate of C2 are connected to the reference voltage supply line that supplies VREF. Although in this example the capacitors are illustrated as being connected to the reference voltage supply line, such connection may made be to any suitable voltage supply line, such as for example to the first power supply line ELVDD or the initialization voltage supply line VINIT. The threshold voltages of the n-type IGZO second drive transistor $IG_D$ and the p-type first drive transistor $T_{DP}$ are stored on the first (bottom) plate of the first storage capacitor C1 with the top plate of C1 being connected to the reference voltage supply line VREF. With transistor IG3 turned off, the gate of the n-type IGZO second drive transistor $IG_D$ is electrically disconnected from the reference voltage line VREF.

The TFT circuit 10 next is operable in a data programming phase during which the data for the current frame is programmed. The SCAN(n) signal level is changed from the low voltage value to the high voltage value, causing transistor IG2 to be placed in the on state. Switch transistor IG2 has a first terminal connected to the gate of the second drive transistor $IG_D$, and a second terminal connected to a data voltage supply line that supplies a data voltage VDAT. As IG2 is turned on the data voltage supply line VDAT is electrically connected to the second (top) plate the storage capacitor C2 and to the gate of the n-type IGZO second drive transistor IG$_D$ through IG2. The data voltage VDAT is changed from the value for another pixel (e.g. the previous row of the display DATA(n−1)) to the data value for the current pixel (e.g. the current row of the display DATA(n)), which is applied from the data voltage line to the second plate of storage capacitor C2 and the gate of the second drive transistor IG$_D$, with the first plate of C2 being connected to the reference voltage supply line VREF.

Also during the data programming phase, an on bias stress (OBS) operation is performed to eliminate hysteresis effects associated with the drive transistors. To perform the OBS operation, the EMI_OBS(n) signal level is changed from the low voltage value to the high voltage value, causing transistor IG5 to be placed in the on state. Switch transistor IG5 has a first terminal connected the driving voltage supply line that supplies the driving voltage ELVDD, and a second terminal connected to the node Vx. As IG5 is turned on, the first terminal (drain) and the second terminal (source) of the n-type IGZO second drive transistor IG$_D$ are electrically connected to each other through IG5. With such connection, ELVDD is applied to the second terminal (source) of the p-type first drive transistor T$_{DP}$, and thus any data voltage change does not affect the voltage at node Vx through gate-drain parasitic capacitance of the second drive transistor IG$_D$. Accordingly, switch transistor IG5 also is referred to as the on bias stress transistor. The voltage at node Vx is also pulled up to ELVDD. The voltage difference of the gate and source of the p-type first drive transistor T$_{DP}$ is ELVDD−(V$_{REF}$−V$_{THn}$−|V$_{THp}$|), which may be larger than 5V to provide a sufficient voltage stress. A high voltage stress between the gate and source reduces the hysteresis of the threshold voltage of the drive transistors. In this context, the hysteresis refers to the dependence of the threshold voltage on the applied gate and source voltage stress, and hysteresis effects are substantially eliminated when the voltage stress is applied by turning on the on bias stress transistor IG5.

At the end of the data programming phase, the SCAN(n) signal level is changed from the high voltage value to the low voltage value, causing transistor IG2 to be placed in the off state. The gate of the n-type IGZO second drive transistor IG$_D$ and the second plate of the second capacitor C2 are electrically disconnected from the data voltage line VDAT, with VDAT being stored at the second plate of the second capacitor C2. VDAT may be changed to a corresponding value for the next row data programming. In addition, the EMI_OBS(n) signal level is changed from the high voltage value to the low voltage value, causing transistor IG5 to be placed in the off state. The source and drain of the second drive transistor IG$_D$ are thus electrically disconnected from each other, and the node Vx is no longer electrically connected to the power supply ELVDD. The EMI(n−2) signal also is changed from the high voltage value to the low voltage value, causing transistor IG4 to be placed in the off state. As transistor IG4 is turned off, the anode of the OLED is electrically disconnected from the initialization voltage supply line VINIT.

The TFT circuit 10 next is operable in an emission phase during which the OLED is capable of emitting light. The EMI(n) signal is changed from the high voltage value to the low voltage value, causing transistor T1 to be placed in the on state. As transistor T1 is turned on, the first terminal (drain) of the p-type first drive transistor T$_{DP}$ is electrically connected to the first terminal (anode) of the OLED. The same current flows through the n-type IGZO second drive transistor IG$_D$, the p-type first drive transistor T$_{DP}$, and the OLED. The current that flows through the n-type IGZO second drive transistor is:

$$I_{dn} = \frac{\beta_{TDN}}{2}(V_{DAT} - V_x - V_{TH_n})^2 \text{ where}$$

$$\beta_{TDN} = \mu_{nn} \cdot C_{oxn} \cdot \frac{W_n}{L_n},$$

$C_{oxn}$ is the capacitance of the n-type IGZO drive transistor gate oxide;
$W_n$ is the width of the n-type IGZO drive transistor channel;
$L_n$ is the length of the n-type IGZO drive transistor channel (i.e. distance between source and drain); and
$\mu_{nn}$ is the carrier mobility of the n-type IGZO drive transistor.

The current that flows through the p-type first drive transistor is $$I_{dp} = \frac{\beta_{TDP}}{2}(V_x - V_G - |V_{TH_{Tp}}|)^2 \text{ where}$$

$$\beta_{TDP} = \mu_{np} \cdot C_{oxp} \cdot \frac{W_p}{L_p},$$

$C_{oxp}$ is the capacitance of the p-type drive transistor gate oxide;
$W_p$ is the width of the p-type drive transistor channel;
$L_p$ is the length of the p-type drive transistor channel (i.e. distance between source and drain); and
VG is the voltage at node G; and
$\mu_{np}$ is the carrier mobility of the p-type drive transistor.
As $I_{dn}=I_{dp}=I_{OLED}$ and $V_G=V_{REF}-V_{THn}-|V_{THp}|$, the current flow through the OLED will be:

$$I_{OLED} = \frac{\beta_{TDN}\beta_{TDP}(V_{REF} - V_{DAT})^2}{2(\sqrt{\beta_{TDN}} + \sqrt{\beta_{TDP}})^2}$$

Accordingly, the current to the OLED does not depend on the threshold voltages of either the p-type first drive transistor T$_{DP}$ or the n-type second drive transistor IG$_D$, and hence the current to the OLED device I$_{OLED}$ is not affected by the threshold voltage variations of the drive transistors. In this manner, any variation in the threshold voltages of the drive transistors has been compensated.

In accordance with the above, the n-type second drive transistor IG$_D$ isolates the power supply ELVDD from the p-type first drive transistor T$_{DP}$. The n-type drive transistor thus functions as a source follower. The source voltage of the n-type drive transistor IG$_D$ at node Vx, which is also the source voltage of the p-type drive transistor T$_{DP}$, is only related to the gate voltage of the n-type drive transistor IG$_D$. The n-type source follower is designed not to limit the current from the supply ELVDD to the OLED, whereas the p-type drive transistor will control or limit the current to the OLED. The current is related to the gate voltage of the p-type transistor and the Vx voltage. As node Vx is isolated from the power supply ELVDD, the current to the OLED, which is controlled by the p-type drive transistor T$_{DP}$, is not affected by the variations of the supply ELVDD, such as the IR drop on that supply line. The p-type drive transistor further is inherently immune from the drain voltage (the power supply ELVSS) variations, at least in first order as is relevant to display applications.

In addition, as described above a two-capacitor structure is used, whereby the first capacitor C1 is used for the threshold compensation to store the threshold voltages of the drive transistors during the compensation phase, and the second capacitor C2 is used to store the data voltage during the programming phase and the emission phase. The threshold compensation and data programming operations thus are independent of each other, and a short one horizontal time can be achieved with a short data programming phase while still performing accurate compensation. The short one horizontal time improves the responsiveness of the OLED. By using IGZO transistor devices as switches, the leakage from storage capacitors C1 and C2 is greatly reduced. In particular, with IG1 as a switch between the gate and the first terminal (drain) of the p-type drive transistor, the leakage from the first plate of the storage capacitor C1 to the drain of the p-type drive transistor is reduced. With IG2 as a switch between the VDAT voltage supply line and the gate of the second drive transistor $IG_D$, the leakage from the second plate of the storage capacitor C2 to the VDAT voltage supply line is reduced. With IG3 as a switch between the reference voltage supply line VREF and the gate of the second drive transistor $IG_D$, the leakage from the second plate of the second storage capacitor C2 to the reference voltage supply line is reduced. Hence, the voltages stored on the storage capacitors C1 and C2 can be retained for a longer time. As a result, as referenced above the refresh rate can be reduced as compared to conventional configurations, down to about 30 Hz or lower, which is particularly suitable for displaying static images.

In addition, by employing the on bias stress transistor IG5 to electrically connect ELVDD to Vx during the data programming phase, hysteresis effects of the drive transistors are eliminated. The reduces the potential for performance deterioration that otherwise could occur due to variation of the threshold voltages of the drive transistors.

As referenced above, the pixel circuit 10 is operable in two modes of operation, with the operation in accordance with FIG. 2 being denoted a normal or refresh operation. Such operation is associated with more dynamic images, which are associated with repeatedly refreshing the data voltage value. Because the data voltage value is refreshed during normal operation, full cycles of the initialization phase, threshold compensation phase, data programming phase, and emission phase are repeated as described above, with the data voltage value being refreshed or updated for each cycle. For more static images, the second mode of operation corresponding to a low frequency operation in accordance with FIG. 3 may be employed, insofar as the data voltage value need not be updated and refreshed. The low frequency operation, therefore, also may be referred to as the non-refresh operation. For enhanced display of a static image while minimizing power consumption, the low frequency operation may be performed multiple times periodically following one refresh operation to program the data voltage.

Referring to the TFT circuit 10 of FIG. 1 in combination with the timing diagram of FIG. 3, for the low frequency or non-refresh operation, the TFT circuit 10 operates to perform in an anode reset phase and the emission phase, with an on bias stress phase being performed during the anode reset phase. During the previous emission phase (similarly as with normal operation), the EMI(n) signal level has a low voltage value, so transistor T1 is on, and light emission is being driven by the input driving voltage ELVDD connected to the IGZO second drive transistor $IG_D$, whereby the actual current applied to the OLED is determined by the voltages at the gate and the first terminal of the p-type first drive transistor $T_{DP}$. The SCAN signal levels for the applicable rows have a low voltage value so switch transistors IG1~IG4 are all in an off state, and the SCAN signals are maintained low through the low frequency refresh operation. The EMI_OBS signal level for the applicable rows initially has a low voltage value so that the on bias stress transistor IG5 also is in an off state.

At the beginning of the anode reset phase, the EMI(n−2) signal level is changed from a low voltage value to a high voltage value, causing transistor IG4 to be placed in the on state. As transistor IG4 is turned on, the first terminal (anode) of the OLED is electrically connected through IG4 to the initialization supply line that supplies the initialization voltage VINIT. As with normal operation, VINIT is set such that any light emission from the OLED is turned off. Also during the anode reset phase, the EMI(n) signal level is changed from a low voltage value to a high voltage value, causing p-type transistor T1 to be turned off, and thus there will be no current flow through the drive transistor $T_{DP}$. By turning off $T_{DP}$ and applying the initialization voltage to the first terminal (anode) of the OLED, the anode voltage is reset to reproduce a similar waveform as in the refresh phase. Such operation reduces the flicker between the refresh phase and the non-refresh phase and keeps the brightness the same between the normal operation and the low frequency operation.

At the beginning of the on bias stress phase, the EMI_OBS(n) signal level is changed from a low voltage value to a high voltage value, causing the on bias stress transistor IG5 to be placed in the on state. As transistor IG5 is turned on, the power supply ELVDD is applied to the second terminal (source) of the p-type first drive transistor $T_{DP}$. The voltage difference of the gate and source of the p-type transistor is ELVDD−($V_{REF}$−$V_{THn}$−|$V_{THp}$|), which again may be larger than 5V for sufficient voltage stress. Similarly as with normal operation, a high voltage stress between the gate and source can reduce the hysteresis of the threshold voltage of the drive transistor. Also during the on bias stress phase, the EMI(n−2) signal is changed from the high voltage value to the low voltage value, causing transistor IG4 to be placed in the off state. As transistor IG4 is turned off, the anode of the OLED is electrically disconnected from the initialization voltage supply line VINIT. At the end of the on bias stress phase, the EMI_OBS(n) signal level is changed from a high voltage value to a low voltage value, causing transistor IG5 to be placed in the off state. As transistor IG5 is turned off, the power supply ELVDD is electrically disconnected from the second terminal (source) of the first drive transistor $T_{DP}$.

The TFT circuit 10 next is operable in the emission phase during which the OLED is capable of emitting light. The EMI(n) signal is changed from the high voltage value to the low voltage value, causing transistor T1 to be placed in the on state. As the gate voltages of $IG_D$ and $T_{DP}$ are maintained the same during the anode reset phase (including the on bias stress phase), the current that flows to OLED will be comparable as in the normal or refresh operation:

$$I_{OLED} = \frac{\beta_{TDN}\beta_{TDP}(V_{REF} - V_{DAT})^2}{2(\sqrt{\beta_{TDN}} + \sqrt{\beta_{TDP}})^2}$$

Accordingly, the low frequency operation performs the anode reset and hysteresis correction on bias stress phases.

The two operations reduce the difference in OLED current as initially set using the normal or refresh operation, and as continuing during the low frequency operation as a static image data voltage value is maintained. During such low frequency operation for a non-refresh frame, only emission control signals are changing, and thus the gate voltages of the drive transistors and the charges on storage capacitors are maintained the same. The power consumption is thereby reduced during a low frequency operation non-refresh frame, insofar as the initialization, threshold compensation, and data programming phases are not performed as such phases are unnecessary given that the data voltage is remaining static. As referenced above, the low frequency operation may be performed multiple times periodically following one refresh operation to reset the pixel circuit while maintaining a previously programmed data voltage value.

Figure 4:
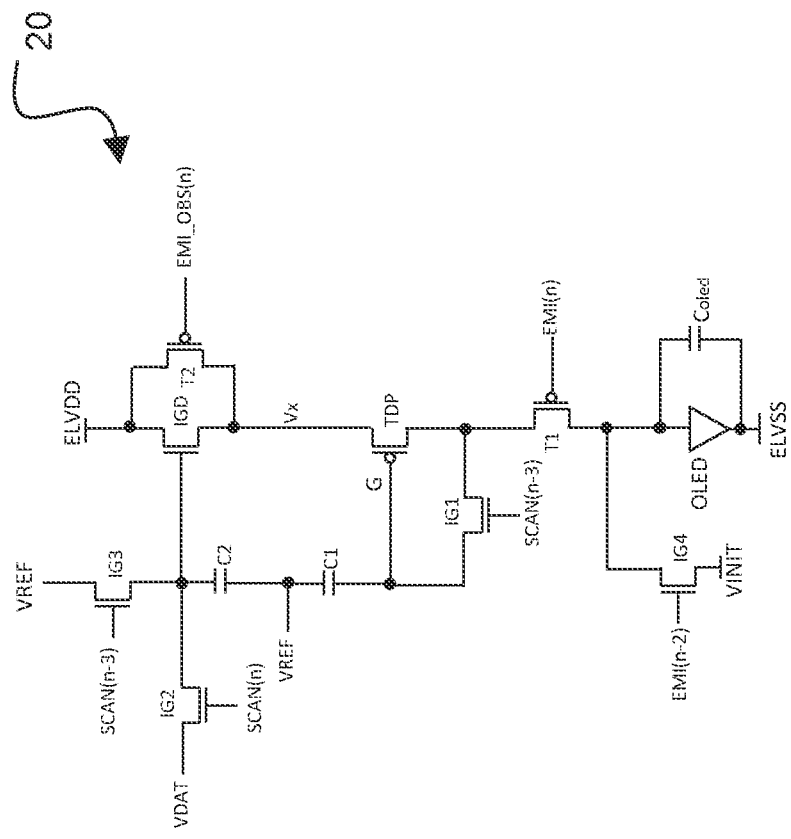
FIG. 4 is a drawing depicting a second circuit configuration in accordance with embodiments of the present application.
Figure 5:
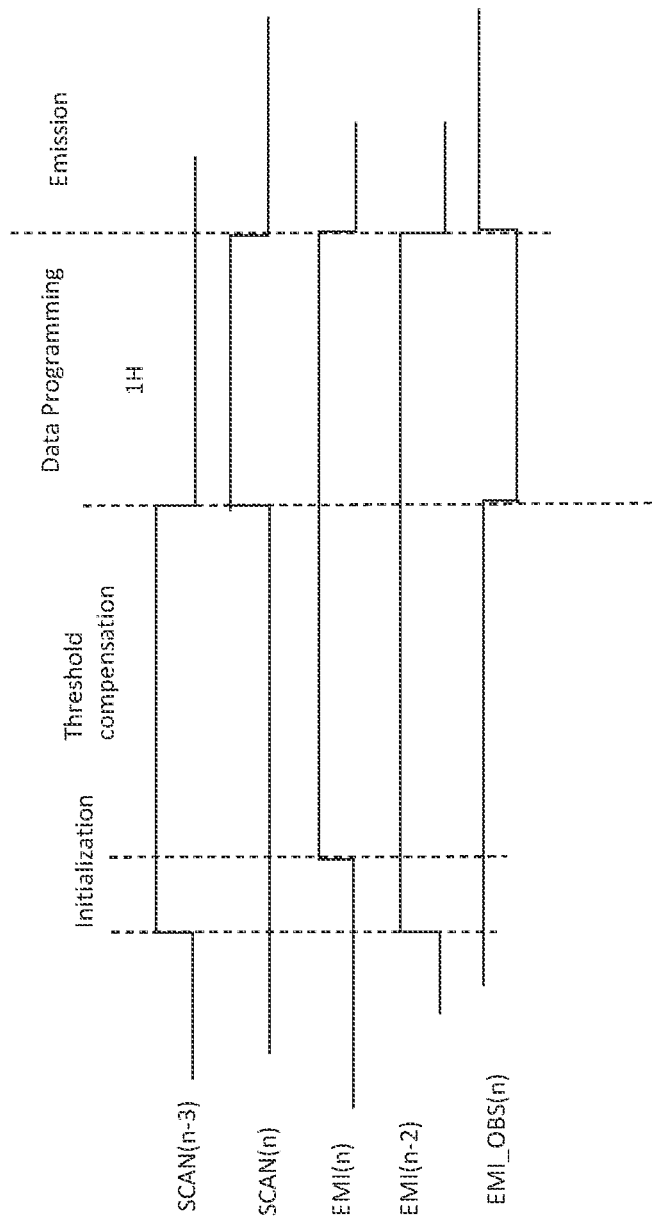
FIG. 5 is a drawing depicting a timing diagram associated with the operation of the circuit of FIG. 4 that is suitable for the refresh operation.
Figure 6:
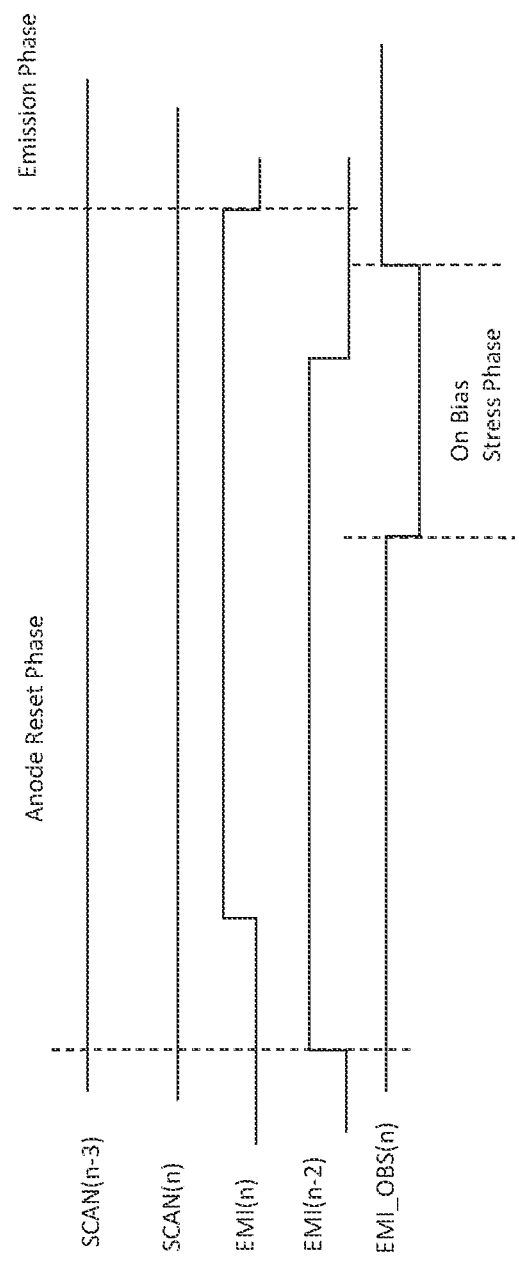
FIG. 6 is a drawing depicting a timing diagram associated with the operation of the circuit of FIG. 4 that is suitable for the low frequency operation.

FIG. 4 is a drawing depicting a second circuit configuration 20 in accordance with embodiments of the present application, and FIG. 5 is a timing diagram associated with the operation of the circuit of FIG. 4 that is suitable for the normal or refresh operation of the circuit configuration 20 of FIG. 4. FIG. 6 is a drawing depicting a timing diagram associated with the operation of the circuit of FIG. 4 that is suitable for low frequency or non-refresh operation of the circuit configuration 20 of FIG. 4. Comparing the circuit configuration 10 of FIG. 1 with the circuit configuration 20 of FIG. 4, in the embodiment of FIG. 4 the on bias stress transistor is configured as a p-type switch transistor T2 (rather than the n-type IG5 on bias stress transistor as shown in FIG. 1). The use of a p-type versus n-type on bias stress transistor may be based on the following. An n-type on bias stress transistor may be configured as a low leakage IGZO transistor, and superior leakage performance is an advantage of using an n-type on bias stress transistor. On the other hand, a p-type on bias stress transistor may have a smaller footprint as compared to an n-type IGZO on bias stress transistor, which can result in an overall size reduction of the circuit configuration.

The circuit configurations 10 and 20 otherwise are structured and operated comparably. Accordingly, as to the normal or refresh operation, the timing diagram of FIG. 5 is largely comparable to that of FIG. 2, and as to the low frequency or non-refresh operation, the timing diagram of FIG. 6 is largely comparable to that of FIG. 3. Accordingly, much the above description applies to both embodiments.

The principal difference of operation is that with the p-type on bias stress transistor T2 of FIG. 4, the control of the EMI-OBS(n) signal must be adjusted commensurately for driving the p-type transistor T2. In particular, as to the normal or refresh operation corresponding to the timing diagram of FIG. 5, during the data programming phase, the EMI_OBS(n) signal level is changed from the high voltage value to the low voltage value, causing transistor T2 to be placed in the on state. As T2 is turned on, similarly as in the previous embodiment, the first terminal (drain) and the second terminal (source) of the n-type IGZO second drive transistor $IG_D$ are electrically connected to each other through T2. With such connection, the ELVDD supply voltage is applied to $T_{DP}$ at the node Vx, and any data voltage change does not affect the voltage at node Vx through gate-drain parasitic capacitance of the second drive transistor $IG_D$. The voltage at node Vx is pulled up to ELVDD. The voltage difference of the gate and source of the p-type first drive transistor $T_{DP}$ is ELVDD-($V_{REF}$-$V_{THn}$-|$V_{THp}$|), which as in the previous embodiment may be larger than 5V to apply sufficient voltage stress. Again, a high voltage stress between the gate and source reduces the hysteresis of the threshold voltage of the drive transistors. At the end of the data programming phase, the EMI_OBS(n) signal level is changed from the low voltage value to the high voltage value, causing transistor T2 to be placed in the off state. The source and drain of the second drive transistor $IG_D$ are thus electrically disconnected from each other, and the node Vx is no longer electrically connected to the power supply ELVDD.

As to the low frequency or non-refresh operation corresponding to the timing diagram of FIG. 6, at the beginning of the on bias stress phase, the EMI_OBS(n) signal level is changed from a high voltage value to a low voltage value, causing the on bias stress transistor T2 to be placed in the on state. As transistor T2 is turned on, the power supply ELVDD is applied to the second terminal (source) of the p-type first drive transistor $T_{DP}$ (node Vx). The voltage difference of the gate and source of the p-type transistor is ELVDD-($V_{REF}$-$V_{THn}$-|$V_{THp}$|), which again may be larger than 5V to provide sufficient voltage stress. Similarly as with normal or refresh operation, a high voltage stress between the gate and source can reduce the hysteresis of the threshold voltage of the drive transistor. At the end of the on bias stress phase, the EMI_OBS(n) signal level is changed from a low voltage value to a high voltage value, causing transistor T2 to be placed in the off state. As transistor T2 is turned off, the power supply ELVDD is electrically disconnected from the second terminal (source) of the first drive transistor $T_{DP}$ (node Vx), and the circuit operation then may proceed to operate in the emission phase.

An aspect of the invention, therefore, is a pixel circuit for a display device whereby the one horizontal time is minimized while maintaining accurate compensation of the threshold voltages of the drive transistors, and an on bias stress operation is performed to apply a voltage stress to eliminate hysteresis effects associated with the drive transistor. In exemplary embodiments, the pixel circuit includes a first drive transistor configured to control an amount of current to a light-emitting device during an emission phase depending upon a voltage applied to a gate of the first drive transistor, the first drive transistor having a first terminal and a second terminal; a second drive transistor that is configured as a source follower relative to the first drive transistor, wherein a first terminal of the second drive transistor is connected to a first power supply line and a second terminal of the second drive transistor is connected to the second terminal of the first drive transistor; wherein the first drive transistor is one of a p-type or n-type transistor and the second drive transistor is the other of a p-type or n-type transistor; and a light-emitting device that is electrically connected at a first terminal to the first terminal of the first drive transistor during the emission phase and is connected at a second terminal to a second power supply line; and an on bias stress switch transistor having a first terminal connected to the first power supply line and the first terminal of the second drive transistor, and a second terminal connected to a node Vx that is a connection of the second terminal of the first drive transistor and the second terminal of the second drive transistor, wherein when the on bias stress switch transistor is in an on state the first power supply line is electrically connected to the node Vx to apply a voltage stress to eliminate hysteresis effects. The pixel circuit may include one or more of the following features, either individually or in combination.

In an exemplary embodiment of the pixel circuit, the pixel circuit further includes a first switch transistor having a first terminal connected to the gate of the first drive transistor and a second terminal connected to the first terminal of the first drive transistor, wherein when the first switch transistor is in an on state the first drive transistor becomes diode-connected such that the gate and the first terminal of the first drive transistor are electrically connected to each other through the first switch transistor.

In an exemplary embodiment of the pixel circuit, the pixel circuit further includes a first capacitor and a second capacitor, wherein the first capacitor has a first plate connected to the gate of the first drive transistor and a second plate connected to a first plate of the second capacitor, and the second capacitor has a second plate connected to a gate of the second drive transistor.

In an exemplary embodiment of the pixel circuit, the pixel circuit further includes a second switch transistor having a first terminal connected to the gate of the second drive transistor and the second plate of the second capacitor, and a second terminal connected to a data voltage supply line that supplies a data voltage, wherein when the second switch transistor is in an on state during a data programming phase, the data voltage is applied to the gate of the second drive transistor and to the second plate of the second capacitor through the second switch transistor.

In an exemplary embodiment of the pixel circuit, the pixel circuit further includes a third switch transistor having a first terminal connected to the gate of the second drive transistor and a second terminal connected to a reference voltage supply line that supplies a reference voltage, wherein when the third switch transistor is in an on state during an initialization phase and during a threshold compensation phase, the reference voltage is applied to the gate of the second drive transistor through the third switch transistor.

In an exemplary embodiment of the pixel circuit, the pixel circuit further includes a fourth switch transistor having a first terminal connected to the first terminal of the light-emitting device and a second terminal connected to an initialization voltage supply line that supplies an initialization voltage, wherein when the fourth switch transistor is in an on state during the initialization phase and during the threshold compensation phase, the initialization voltage is applied to the first terminal of the light-emitting device through the fourth switch transistor.

In an exemplary embodiment of the pixel circuit, the pixel circuit further includes a fifth switch transistor having a first terminal connected to the first terminal of the light-emitting device and a second terminal connected to the first terminal of the first drive transistor; wherein when the fifth switch transistor is in an on state during the initialization phase the initialization voltage is applied to the gate of the first drive transistor through the fourth, fifth, and first switch transistors; and wherein when the fifth switch transistor is in an on state during the emission phase, current flows from the first power supply line to the light-emitting device through the first and second drive transistors and the fifth switch transistor.

In an exemplary embodiment of the pixel circuit, the fifth switch transistor is a p-type transistor.

In an exemplary embodiment of the pixel circuit, a node connection of the second plate of the first capacitor and the first plate of the second capacitor is connected to one of the first power supply line, a reference voltage supply line, or an initialization voltage supply line; and wherein the first capacitor stores threshold voltages of the first drive transistor and the second drive transistor to compensate the threshold voltages of the drive transistors for light emission, and the second capacitor stores a data voltage for light emission.

In an exemplary embodiment of the pixel circuit, the on bias stress switch transistor is an n-type transistor.

In an exemplary embodiment of the pixel circuit, the on bias stress switch transistor is a p-type transistor.

In an exemplary embodiment of the pixel circuit, one or more of the switch transistors is an indium gallium zinc oxide transistor.

In an exemplary embodiment of the pixel circuit, the light-emitting device is one of an organic light-emitting diode, a micro light-emitting diode (LED), or a quantum dot LED.

Another aspect of the invention is a method of operating the pixel to circuit to provide such enhanced performance. In exemplary embodiments, the method of operating a pixel circuit for a display device includes the steps of providing a pixel circuit according to any of the embodiments; performing a compensation phase to compensate threshold voltages of the first and second drive transistors comprising: diode connecting the first drive transistor by placing the first switch transistor in an on state to electrically connect the gate and the first terminal of the first drive transistor to each other through the first switch transistor; placing the third switch transistor in an on state and applying the reference voltage from the reference voltage supply line to the gate of the second drive transistor through the third switch transistor; and electrically disconnecting the first terminal of the light emitting device from the second terminal of the first drive transistor; wherein threshold voltages of the first and second drive transistors are stored on the first plate of the first capacitor; performing a data programming phase comprising: placing the on bias stress switch transistor in an on state thereby electrically connecting the first power supply line to the node Vx through the on bias stress switch transistor to apply a voltage stress to eliminate hysteresis effects; following the voltage stress placing the on bias stress transistor in an off state; and placing the second switch transistor and in an on state and applying the data voltage from the data voltage line through the second switch transistor to the second plate of the second capacitor and to the gate of the second drive transistor; and performing an emission phase during which light is emitted from the light-emitting device comprising: applying the first power supply to the first terminal of the second drive transistor, and electrically connecting the first terminal of the light-emitting device to the first terminal of the first drive transistor thereby applying the first power supply to the light-emitting device. The method of operating may include one or more of the following features, either individually or in combination.

In an exemplary embodiment of the method of operating, the method further includes placing the fourth switch transistor in an on state during an initialization phase and during the threshold compensation phase, and applying the initialization voltage to the first terminal of the light-emitting device through the fourth switch transistor.

In an exemplary embodiment of the method of operating, the method further includes the initialization phase further includes placing the fifth switch transistor in an on state thereby applying the initialization voltage to the gate of the first drive transistor through the fourth, fifth, and first switch transistors; and the emission phase further includes placing the fifth switch transistor in an on state such that current flows from the first power supply line to the light-emitting device through the first and second drive transistors and the fifth switch transistor In an exemplary embodiment of the method of operating, the method includes performing a low frequency operation during which the data voltage is maintained, the low frequency operation including the steps of: performing a reset phase to reset a voltage at the first terminal of the light-emitting device comprising electrically disconnecting the first terminal of the light-emitting device from the first terminal of the first drive transistor, and applying an initialization voltage to the first terminal of the light emitting device; performing an on bias stress phase comprising placing the on bias stress switch transistor in an on state thereby electrically connecting the first power supply line to the node Vx through the on bias stress switch transistor to apply a voltage stress to eliminate hysteresis effects, and following the voltage stress placing the on bias stress transistor in an off state; and performing the emission phase.

In an exemplary embodiment of the method of operating, the on bias stress phase further comprises electrically disconnecting the first terminal of the light-emitting device from the initialization voltage supply line.

In an exemplary embodiment of the method of operating, the low frequency operation is performed multiple times periodically following one refresh operation according to any of the embodiments.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present application are applicable to many display devices to permit display devices of high resolution with effective threshold voltage compensation and true black performance. Examples of such devices include televisions, mobile phones, personal digital assistants (PDAs), tablet and laptop computers, desktop monitors, digital cameras, and like devices for which a high resolution display is desirable.

REFERENCE SIGNS LIST

10—first circuit configuration
20—second circuit configuration
T1-T2—p-type switch transistors
$T_{DP}$—p-type first drive transistor
IG1~IG5—multiple n-type switch transistors
$IG_D$—n-type second drive transistor
OLED—organic light emitting diode (or generally light-emitting device)
C1, C2—first and second storage capacitors
$C_{oled}$—internal capacitance of OLED
G—Node in the pixel circuits
Vx—Node in the pixel circuits
ELVDD—driving voltage power supply
ELVSS—light-emitting device power supply
VREF—reference voltage supply line and reference voltage
VINIT—initialization voltage supply line and data voltage
VDAT—data voltage supply line and data voltage
SCAN//EMI/EMI_OBS—control signals

What is claimed is:

1. A pixel circuit for a display device comprising:
a first drive transistor configured to control an amount of current to a light-emitting device during an emission phase depending upon a voltage applied to a gate of the first drive transistor, the first drive transistor having a first terminal and a second terminal;
a second drive transistor that is configured as a source follower relative to the first drive transistor, wherein a first terminal of the second drive transistor is connected to a first power supply line and a second terminal of the second drive transistor is connected to the second terminal of the first drive transistor;
wherein the first drive transistor is one of a p-type or n-type transistor and the second drive transistor is the other of a p-type or n-type transistor; and
a light-emitting device that is electrically connected at a first terminal to the first terminal of the first drive transistor during the emission phase and is connected at a second terminal to a second power supply line; and
an on bias stress switch transistor having a first terminal connected to the first power supply line and the first terminal of the second drive transistor, and a second terminal connected to a node Vx that is a connection of the second terminal of the first drive transistor and the second terminal of the second drive transistor, wherein when the on bias stress switch transistor is in an on state the first power supply line is electrically connected to the node Vx to apply a voltage stress to eliminate hysteresis effects.

2. The pixel circuit of claim 1, further comprising a first switch transistor having a first terminal connected to the gate of the first drive transistor and a second terminal connected to the first terminal of the first drive transistor, wherein when the first switch transistor is in an on state the first drive transistor becomes diode-connected such that the gate and the first terminal of the first drive transistor are electrically connected to each other through the first switch transistor.

3. The pixel circuit of claim 2, further comprising a first capacitor and a second capacitor, wherein the first capacitor has a first plate connected to the gate of the first drive transistor and a second plate connected to a first plate of the second capacitor, and the second capacitor has a second plate connected to a gate of the second drive transistor.

4. The pixel circuit of claim 3, further comprising a second switch transistor having a first terminal connected to the gate of the second drive transistor and the second plate of the second capacitor, and a second terminal connected to a data voltage supply line that supplies a data voltage, wherein when the second switch transistor is in an on state during a data programming phase, the data voltage is applied to the gate of the second drive transistor and to the second plate of the second capacitor through the second switch transistor.

5. The pixel circuit of claim 4, further comprising a third switch transistor having a first terminal connected to the gate of the second drive transistor and a second terminal connected to a reference voltage supply line that supplies a reference voltage, wherein when the third switch transistor is in an on state during an initialization phase and during a threshold compensation phase, the reference voltage is applied to the gate of the second drive transistor through the third switch transistor.

6. The pixel circuit of claim 5, further comprising a fourth switch transistor having a first terminal connected to the first terminal of the light-emitting device and a second terminal connected to an initialization voltage supply line that supplies an initialization voltage, wherein when the fourth switch transistor is in an on state during the initialization phase and during the threshold compensation phase, the initialization voltage is applied to the first terminal of the light-emitting device through the fourth switch transistor.

7. The pixel circuit of claim 6, further comprising a fifth switch transistor having a first terminal connected to the first terminal of the light-emitting device and a second terminal connected to the first terminal of the first drive transistor;
 wherein when the fifth switch transistor is in an on state during the initialization phase the initialization voltage is applied to the gate of the first drive transistor through the fourth, fifth, and first switch transistors; and
 wherein when the fifth switch transistor is in an on state during the emission phase, current flows from the first power supply line to the light-emitting device through the first and second drive transistors and the fifth switch transistor.

8. The pixel circuit of claim 7, wherein the fifth switch transistor is a p-type transistor.

9. The pixel circuit of claim 3, wherein a node connection of the second plate of the first capacitor and the first plate of the second capacitor is connected to one of the first power supply line, a reference voltage supply line, or an initialization voltage supply line; and
 wherein the first capacitor stores threshold voltages of the first drive transistor and the second drive transistor to compensate the threshold voltages of the drive transistors for light emission, and the second capacitor stores a data voltage for light emission.

10. The pixel circuit of claim 1, wherein the on bias stress switch transistor is an n-type transistor.

11. The pixel circuit of claim 1, wherein the on bias stress switch transistor is a p-type transistor.

12. The pixel circuit of claim 2, wherein one or more of the switch transistors is an indium gallium zinc oxide transistor.

13. The pixel circuit of claim 1, wherein the light-emitting device is one of an organic light-emitting diode, a micro light-emitting diode (LED), or a quantum dot LED.

14. A method of operating a pixel circuit for a display device comprising the steps of:
 providing a pixel circuit comprising:
  a first drive transistor configured to control an amount of current to a light-emitting device during an emission phase depending upon a voltage applied to a gate of the first drive transistor, the first drive transistor having a first terminal and a second terminal;
  a second drive transistor that is configured as a source follower relative to the first drive transistor, wherein a first terminal of the second drive transistor is connected to a first power supply line and a second terminal of the second drive transistor is connected to the second terminal of the first drive transistor;
  wherein the first drive transistor is one of a p-type or n-type transistor and the second drive transistor is the other of a p-type or n-type transistor;
  a light-emitting device that is electrically connected at a first terminal to the first terminal of the first drive transistor during the emission phase and is connected at a second terminal to a second power supply line;
  an on bias stress switch transistor having a first terminal connected to the first power supply line and the first terminal of the second drive transistor, and a second terminal connected to a node Vx that is a connection of the second terminal of the first drive transistor and the second terminal of the second drive transistor;
  a first switch transistor having a first terminal connected to the gate of the first drive transistor and a second terminal connected to the first terminal of the first drive transistor;
  a first capacitor and a second capacitor, wherein the first capacitor has a first plate connected to the gate of the first drive transistor and a second plate connected to a first plate of the second capacitor, and the second capacitor has a second plate connected to the gate of the second drive transistor;
  a second switch transistor having a first terminal connected to a gate of the second drive transistor and the second plate of the second capacitor, and a second terminal connected to a data voltage supply line that supplies a data voltage; and
  a third switch transistor having a first terminal connected to the gate of the second drive transistor and a second terminal connected to a reference voltage supply line that supplies a reference voltage;
 performing a compensation phase to compensate threshold voltages of the first and second drive transistors comprising: diode connecting the first drive transistor by placing the first switch transistor in an on state to electrically connect the gate and the first terminal of the first drive transistor to each other through the first switch transistor; placing the third switch transistor in an on state and applying the reference voltage from the reference voltage supply line to the gate of the second drive transistor through the third switch transistor; and electrically disconnecting the first terminal of the light emitting device from the second terminal of the first drive transistor; wherein threshold voltages of the first and second drive transistors are stored on the first plate of the first capacitor;
 performing a data programming phase comprising: placing the on bias stress switch transistor in an on state thereby electrically connecting the first power supply line to the node Vx through the on bias stress switch transistor to apply a voltage stress to eliminate hysteresis effects; following the voltage stress placing the on bias stress transistor in an off state; and placing the second switch transistor and in an on state and applying the data voltage from the data voltage line through the second switch transistor to the second plate of the second capacitor and to the gate of the second drive transistor; and
 performing an emission phase during which light is emitted from the light-emitting device comprising: applying the first power supply to the first terminal of the second drive transistor, and electrically connecting the first terminal of the light-emitting device to the first terminal of the first drive transistor thereby applying the first power supply to the light-emitting device.

15. The method of operating of claim 14, wherein the pixel circuit further comprises a fourth switch transistor having a first terminal connected to the first terminal of the light-emitting device and a second terminal connected to an initialization voltage supply line that supplies an initialization voltage; and the method further comprises placing the fourth switch transistor in an on state during an initialization phase and during the threshold compensation phase, and applying the initialization voltage to the first terminal of the light-emitting device through the fourth switch transistor.

16. The method of operating of claim 14, wherein:
the pixel circuit further comprises a fifth switch transistor having a first terminal connected to the first terminal of the light-emitting device and a second terminal connected to the first terminal of the first drive transistor;
the initialization phase further comprises placing the fifth switch transistor in an on state thereby applying the initialization voltage to the gate of the first drive transistor through the fourth, fifth, and first switch transistors; and
the emission phase further comprises placing the fifth switch transistor in an on state such that current flows from the first power supply line to the light-emitting device through the first and second drive transistors and the fifth switch transistor.

17. A method of operating a pixel circuit for a display device comprising the steps of:
performing a refresh operation comprising the method of operating of claim 14 to program the data voltage to the pixel circuit; and
performing a low frequency operation during which the data voltage is maintained, the low frequency operation comprising the steps of:
performing a reset phase to reset a voltage at the first terminal of the light-emitting device comprising electrically disconnecting the first terminal of the light-emitting device from the first terminal of the first drive transistor, and applying an initialization voltage to the first terminal of the light emitting device;
performing an on bias stress phase comprising placing the on bias stress switch transistor in an on state thereby electrically connecting the first power supply line to the node Vx through the on bias stress switch transistor to apply a voltage stress to eliminate hysteresis effects, and following the voltage stress placing the on bias stress transistor in an off state; and
performing the emission phase.

18. The method of operating of claim 17, wherein the on bias stress phase further comprises electrically disconnecting the first terminal of the light-emitting device from the initialization voltage supply line.

19. The method of operating of claim 17, wherein the low frequency operation is performed multiple times periodically following one refresh operation.

20. A method of low frequency operation of a pixel circuit for a display device comprising the steps of:
providing a pixel circuit comprising:
a first drive transistor configured to control an amount of current to a light-emitting device during an emission phase depending upon a voltage applied to a gate of the first drive transistor, the first drive transistor having a first terminal and a second terminal;
a second drive transistor that is configured as a source follower relative to the first drive transistor, wherein a first terminal of the second drive transistor is connected to a first power supply line and a second terminal of the second drive transistor is connected to the second terminal of the first drive transistor;
wherein the first drive transistor is one of a p-type or n-type transistor and the second drive transistor is the other of a p-type or n-type transistor;
a light-emitting device that is electrically connected at a first terminal to the first terminal of the first drive transistor during the emission phase and at a second terminal to a second power supply line; and
an on bias stress switch transistor having a first terminal connected to the first power supply line and the first terminal of the second drive transistor, and a second terminal connected to a node Vx that is a connection of the second terminal of the first drive transistor and the second terminal of the second drive transistor;
performing a reset phase to reset a voltage at the first terminal of the light-emitting device comprising electrically disconnecting the first terminal of the light-emitting device from the first terminal of the first drive transistor, and applying an initialization voltage to the first terminal of the light-emitting device;
performing an on bias stress phase comprising placing the on bias stress switch transistor in an on state thereby electrically connecting the first power supply line to the node Vx through the on bias stress switch transistor to apply a voltage stress to eliminate hysteresis effects; electrically disconnecting the first terminal of the light-emitting device from the initialization voltage; and following the voltage stress placing the on bias stress transistor in an off state; and
performing an emission phase during which light is emitted from the light-emitting device comprising: applying the first power supply to the first terminal of the second drive transistor, and electrically connecting the first terminal of the light-emitting device to the first terminal of the first drive transistor thereby applying the first power supply to the light-emitting device;
wherein a data voltage previously programmed to the pixel circuit is maintained during the low frequency operation.

* * * * *